US012665046B2

(12) United States Patent
Basuta et al.

(10) Patent No.: US 12,665,046 B2
(45) Date of Patent: Jun. 23, 2026

(54) MEMORY REPAIRS

(71) Applicant: Micron Technology, Inc., Boise, ID (US)

(72) Inventors: Sukneet S. Basuta, San Jose, CA (US); Kenneth M. Curewitz, Plymouth, MA (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 18/775,881

(22) Filed: Jul. 17, 2024

(65) Prior Publication Data

US 2025/0087294 A1    Mar. 13, 2025

Related U.S. Application Data

(60) Provisional application No. 63/538,015, filed on Sep. 12, 2023.

(51) Int. Cl.
*G06F 3/06*        (2006.01)
*G11C 29/00*        (2006.01)
(52) U.S. Cl.
CPC .......... *G11C 29/702* (2013.01); *G11C 29/789* (2013.01)

(58) Field of Classification Search
CPC .. G06F 11/1048; G06F 3/0604; G06F 3/0619; G06F 3/0631; G06F 3/065; G06F 3/0688
See application file for complete search history.

(56) References Cited

U.S. PATENT DOCUMENTS

| | | | |
|---|---|---|---|
| 9,064,330 B2 | 6/2015 | Ginzburg | |
| 10,169,089 B2 | 1/2019 | Zhang | |
| 2014/0281161 A1* | 9/2014 | Chen | G06F 12/0246 |
| | | | 711/103 |
| 2015/0089327 A1 | 3/2015 | Youn | |
| 2016/0216910 A1 | 7/2016 | Phan | |
| 2018/0268921 A1* | 9/2018 | Lee | G11C 29/765 |
| 2025/0087294 A1* | 3/2025 | Basuta | G11C 29/76 |
| 2025/0291484 A1* | 9/2025 | Wang | G06F 11/07 |

FOREIGN PATENT DOCUMENTS

WO        2016-171819 A1    10/2016

* cited by examiner

*Primary Examiner* — Yong J Choe
(74) *Attorney, Agent, or Firm* — Brooks, Cameron & Huebsch, PLLC

(57)        ABSTRACT

Memory devices can be protected (e.g., repaired) against hard bit errors by remapping logical pages to valid physical addresses and excluding those physical addresses having hard bit errors from being mapped to. The remapping can be done in unit of a finer granularity than a row of memory cells such that those valid memory cells within a row can still be used for the remapping despite that the row may include unusable memory cells.

18 Claims, 4 Drawing Sheets

440 —

| LOGICAL PAGE | DEVICE PAGE | |
|---|---|---|
| 4012 | 4201 | 442-1 |
| 4201 | 64B of 4304 (Bank 0) + 64B of 7890 (Bank 1) | 442-2 |
| . . . | . . . | |
| 7890 | 9999 | 442-Y |

*FIG. 4*

MEMORY REPAIRS

PRIORITY INFORMATION

This application claims the benefit of U.S. Provisional Application No. 63/538,015, filed on Sep. 12, 2023, the contents of which are incorporated herein by reference.

TECHNICAL FIELD

The present disclosure relates generally to semiconductor memory and methods, and more particularly, to apparatuses, systems, and methods for memory repairs.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

BRIEF DESCRIPTION OF THE DRAWINGS

FIG. 4 is a diagram illustrating a logical to physical (L2P) table indicative of logical pages remapped in response to a repair performed in accordance with a number of embodiments of the present disclosure.

DETAILED DESCRIPTION

Figure 1:
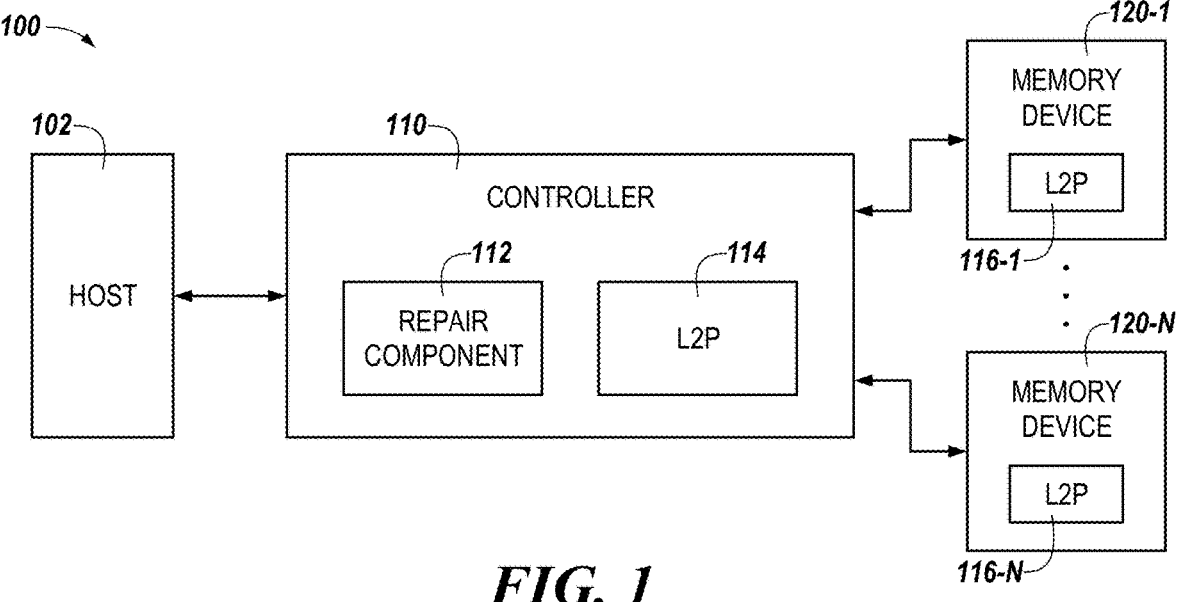
FIG. 1 is a block diagram of an apparatus in the form of a computing system including a host, a controller, and a memory device in accordance with a number of embodiments of the present disclosure.

Systems, apparatuses, and methods related to memory repairs are described. A memory device can be accessed according to various interface protocols, such as a double data rate (DDR) protocol. For example, various memory devices such as DRAM devices, FeRAM devices, etc., can be accessed according to a DDR protocol. To protect memory devices against hard bit errors, the memory device can be often "repaired" by remapping a logical page previously remapped to those "bad" memory cells determined to be unreliable (e.g., having hard bit errors) to different memory cells of the memory device. In some approaches, this repair has been done by remapping the logical page to a different row of memory cells and entirely retiring (e.g., not using) the "unreliable" row of memory cells. Alternatively speaking, each row of memory cells has been a unit of substitution in various memory repair approaches, which can waste those "good" memory cells from the row considered unreliable.

Aspects of the present disclosure address the above and other challenges for this type of repair performed on various memory devices (e.g., DRAM devices, FeRAM devices, etc.). In a number of embodiments, a memory device can be accessed according to a DDR protocol, but operated at a finer granularity than a typical DRAM device, which can provide benefits such as reducing the quantity of "good" memory cells that would otherwise be wasted via prior memory repair approaches (e.g., prior approaches that may remap entire rows of cells).

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 124 may reference element "24" in FIG. 1, and a similar element may be referenced as 224 in FIG. 2.

Analogous elements within a Figure may be referenced with a hyphen and extra numeral or letter. See, for example, elements 221-1, . . . , 121-N in FIG. 1. Such analogous elements may be generally referenced without the hyphen and extra numeral or letter. For example, elements 221-1, . . . , 121-N may be collectively referenced as 121. As used herein, the designators "N", "X", "Y", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a computing system 100 including a host 102, a controller 110, and a memory device 120-1, . . . , 120-N (collectively referred to as memory devices 120) in accordance with a number of embodiments of the present disclosure. As used herein, a host 102, a controller 110, and a memory device 120 might also be separately considered an "apparatus."

In various embodiments, the host 102 can be a host system, such as a personal laptop computer, a desktop computer, a digital camera, a smart phone, a memory card reader, and/or internet-of-thing enabled device, among various other types of hosts. The host 102 can include a system motherboard and/or backplane and can include a number of processing resources (e.g., one or more processors, microprocessors, or some other type of controlling circuitry). The system 100 can include separate integrated circuits or the host, the host 102 and the memory device 120 can be on the same integrated circuit. The system 100 can be, for instance, a server system and/or a high performance computing (HPC) system and/or a portion thereof.

The controller 110 can control, in response to receiving a request from the host 102, performance of a memory operation. Examples of the memory operation include a read operation to read data from a memory device 120 or a write operation to write data to a memory device 120. The controller 110 can further provide various error correction/ detection capabilities to, for example, correct (e.g., soft and/or hard) bit errors on data read from the memory devices 120. The capabilities can be provided using various types of error correction code (ECC), such as Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others. As a non-limiting example, the controller 110 can be operated based on Hamming code and generate parity symbols (as ECC symbols). The controller 110 can include circuitry and/or firmware in order to perform ECC operations.

The controller 110 can be coupled to the host 102 via multiple input/output (I/O) lanes (not shown in FIG. 1), which can be any quantity, such as eight, sixteen, or another quantity of I/O lanes. In at least one embodiment, the interface coupling between the memory controller 110 and the host 102 can be a PCIe physical and electrical interface operated according to a CXL protocol.

One example of the memory devices 120 is a random access memory (RAM) operated according to a protocol such as low-power double data rate (LPDDRx), which may be referred to herein as LPDDRx devices, LPDDRx memory, etc. One or more of the memory devices 120 can include FeRAM, PCRAM, RRAM, MRAM, DRAM, and STTRAM, among others. The "x" in LPDDRx refers to any of a number of generations of the protocol (e.g., LPDDR5). In at least one embodiment, at least one of the memory devices 120 is operated as an LPDDRx device with low-power features enabled and at least one of the memory devices 120-N is operated as an LPDDRx device with at least one low-power feature disabled. In some embodiments, although the memory devices 120 are LPDDRx memory devices, the memory devices 120 do not include circuitry configured to provide low-power functionality for the memory devices 120 such as a dynamic voltage frequency scaling core (DVFSC), a sub-threshold current reduce circuit (SCRC), or other low-power functionality providing circuitry. Providing the LPDDRx memory devices 120 without such circuitry can advantageously reduce the cost, size, and/or complexity of the LPDDRx memory devices 120. By way of example, an LPDDRx memory device 120 with reduced low-power functionality providing circuitry can be used for applications other than mobile applications (e.g., if the memory is not intended to be used in a mobile application, some or all low-power functionality may be sacrificed for a reduction in the cost of producing the memory).

As illustrated in FIG. 1, the controller can further include a memory (shown as "L2P") 114 that can store logical to physical (L2P) mapping or translation data and/or lookup tables in a memory array in order to track the location of data in the memory device. The L2P memory 114 can be a cache memory, such as a SRAM memory.

In some embodiments, L2P information can be managed at a device-level, such as at the respective memory device 120. For example, each memory device 120 can include a respective memory (shown as "L2P") 116-1, . . . , 116-N that can store logical to physical mapping or translation data and/or lookup tables that correspond to physical locations of the respective memory device 120.

As illustrated in FIG. 1, the controller 110 can further include a repair component 112. Although not shown in FIG. 1 so as to not obfuscate the drawings, the repair component 112 can include various circuitry to facilitate performance of operations described herein. For example, the repair component 112 can determine whether at least a portion (e.g., one or more memory cells) of the memory devices 120 is unreliable (e.g., due to hard bit errors) and perform a repair operation by remapping logical pages to exclude those "bad" memory cells (e.g., memory cells determined to be unreliable) of the banks 221 from being mapped. Instead, those "good" memory cells in a row (e.g., having a size of 2 kB, 8 kB, etc.) having the "bad" memory cells can be still used and mapped to logical pages. As used herein, the term "bad memory cell" (alternatively referred to as "unreliable memory cell") refers to a memory cell determined to have a hard bit error. As used herein, the term "hard bit error" refers to an error caused by physical damage to, malfunction, and/or defect of a memory cell storing the bit error so as to makes the memory cell unreliable (as reprogramming of the memory cell may not correct the hard bit error). In contrast, the term "soft error" refers to an error that is not caused by physical damage to, malfunction, and/or defect of a memory cell such that the bit error may be correctable (e.g., by reprogramming of the memory cell and/or via ECC schemes, etc.). In some embodiments, some logical pages can be mapped to memory cells in different banks of each memory device 120 as further illustrated in connection with FIGS. 3 and 4.

A scan operation that can be performed by the repair component 112 to determine whether particular portions (e.g., banks 221 illustrated in FIG. 2) of the memory device 120 are unreliable can be performed either on initialization (e.g., power-up) or on the fly (e.g., while the memory devices 120 are in operation). For example, a scan operation can be performed upon initialization in response to a power event (e.g., the power up) of the memory device 120. For example, when the system 100 and/or the memory device 120 is powered up, the controller 110 can write a (e.g., predetermined) data pattern to the memory device 120, read the data pattern from the memory device 120, and determine whether or not the data patterns match. Although embodiments are not limited, a data pattern written to the memory device 120 can be a predetermined data pattern that may be all "0"s or "1"s, or include both bit values "0" and "1". A determination that the two data patterns do not match can indicate one or more hard bit errors, and the controller 110 can repair those physical addresses (e.g., rows or row portions) indicated as having the hard bit errors in response (e.g., by remapping logical addresses to exclude the physical addresses).

In some embodiments, a scan operation can be performed "on the fly" (e.g., as a background operation, which can be performed independently of the host 102). In some embodiments, a scan operation can be performed with an ECC feature of the controller 110 disabled so as not to confuse hard bit errors with soft bit errors. For example, with the ECC feature disabled, a data pattern can be read from the memory device without correcting soft bit errors.

The scan operation can be performed (e.g., repetitively) on all banks (e.g., banks 221 illustrated in FIG. 2) of the memory device 120. Subsequent to the scan operation and/or the repair performed by the controller 110, the controller 110 can report a total size of the memory device 120 (e.g., a size of the memory device 120 that excludes those "bad" memory cells) to the host 102 (e.g., BIOS/SOC).

Figure 2:
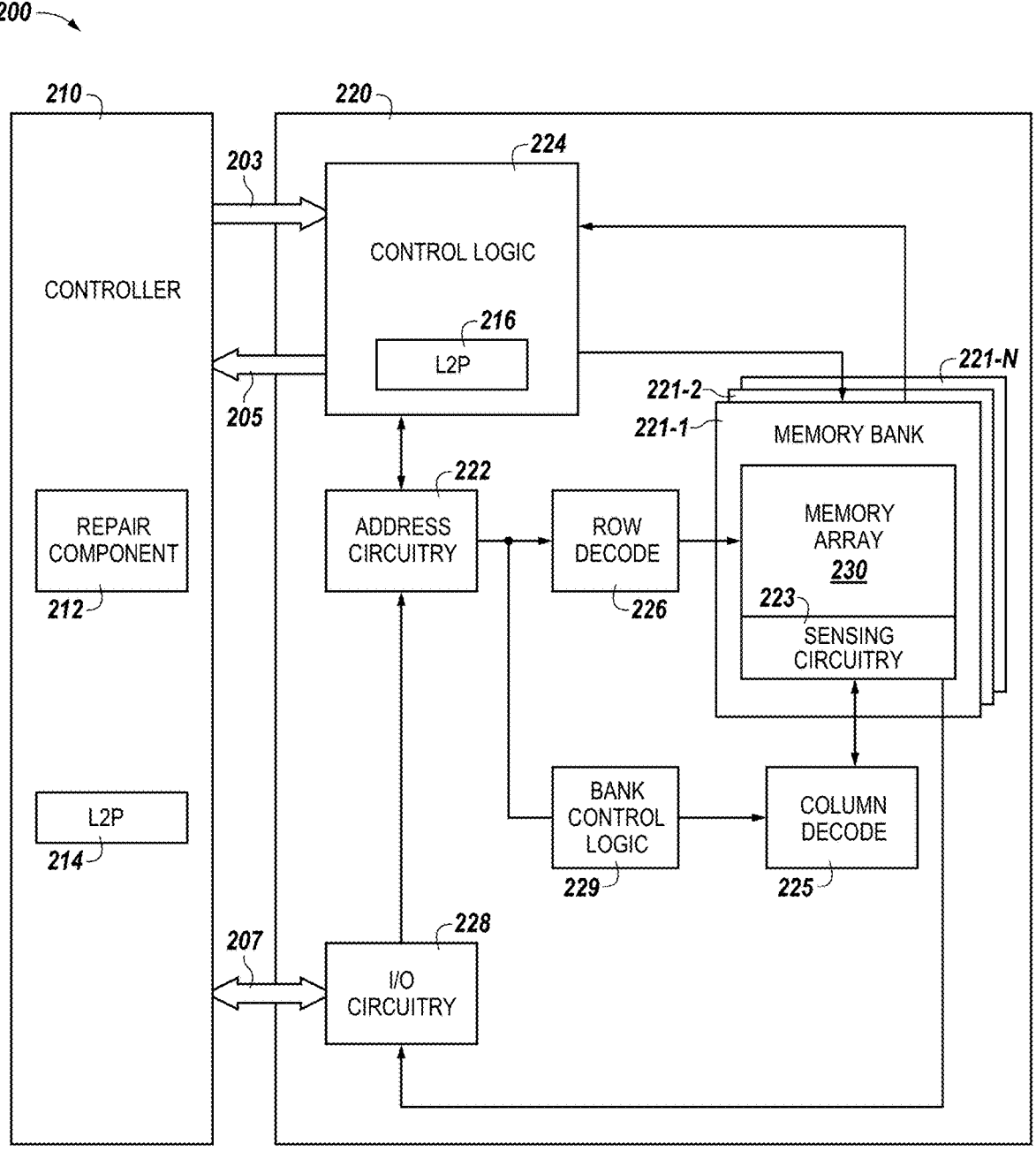
FIG. 2 is a block diagram of a controller and a memory device in accordance with a number of embodiments of the present disclosure.

FIG. 2 is a block diagram of a system 200 including a controller 210 and a memory device 220 in accordance with a number of embodiments of the present disclosure. The controller 210 (along with repair component 212 and memory 214) and memory device 220 (along with memory 216) can be analogous to controller 110 (along with repair component 112 and memory 114) and memory device 120 (along with memory 216) illustrated in FIG. 1.

The memory device 220 (e.g., memory die) can include a number of memory banks 221-1, 221-2, . . . , 221-M (e.g., collectively referred to as memory banks 221) that can include a memory array 230 including multiple rows and columns of storage units and sensing circuitry 223. Although not illustrated in FIG. 2, each one of the memory banks 221 can include control circuitry (e.g., a bank processor) to control and/or orchestrate performance of memory operations in response to instructions received from the control logic 224. In some embodiments, each one of the memory banks 221 can be addressed separately, for example, by the control logic 224.

The array 230 can include memory cells arranged in rows coupled by access lines (which may be referred to herein as word lines or select lines) and columns coupled by sense lines (which may be referred to herein as data lines or digit lines). The memory array 230 can include various/different types of memory cells. For instance, the memory array 230 can be FeRAM, PCRAM, RRAM, MRAM, DRAM, and STTRAM, among others. As an example, a FeRAM memory can include ferroelectric capacitors and can perform bit storage based on an amount of voltage or charge applied thereto. In such examples, relatively small and relatively large voltages allow the FeRAM memory to exhibit characteristics similar to normal dielectric materials (e.g., dielectric materials that have a relatively high dielectric constant) but at various voltages between such relatively small and large voltages the FeRAM memory can exhibit a polarization reversal that yields non-linear dielectric behavior.

The memory device 220 can include address circuitry 222 to latch address signals for data provided over an input/output "I/O" bus 107 (e.g., data bus and/or address bus) through I/O circuitry 228 (e.g., provided to external ALU circuitry and to DRAM DQs via local I/O lines and global I/O lines). The internal I/O bus can transfer data between memory banks 221 and I/O pins (e.g., DQs), for example.

The address signals from the address circuitry 222 can be provided to row decode circuitry 226, column decode circuitry 225, and/or bank control logic 229. The bank control logic 229 can activate the row decode circuitry 226 and/or column decode circuitry 225 that corresponds to the bank address received from the address circuitry 222.

In response to being activated by the bank control logic 229, the column decode circuitry 225 and the row decode circuitry 226 each can decode the signals received from the address circuitry 222 to access the memory array 230. The row decode circuitry 226 can include logic (e.g., multiplexer circuitry), which can selectively coupled shared I/O lines to subsets of sensing components corresponding to the received row address and/or bank address from the address circuitry 222 and bank control logic 229, respectively. The column decode circuitry 225 can latch the column address and applies the latched column address to a decoder of the column decode circuitry 225.

Address signals are received through address circuitry 222 and decoded by a row decoder 226 and a column decoder 225 to access the memory array 230. Data can be read from the memory array 230 by sensing voltage and/or current changes on sense lines (digit lines) using the sensing circuitry 223. The sensing circuitry 223 can read and latch data in various sizes (e.g., a physical sub-page, a physical page, or a row of memory cells) of data from the memory array 230. Although not specifically illustrated in FIG. 2, the sensing circuitry 223 can further include sense amplifiers, buffers, etc. that can be used to read and latch data. The I/O circuitry 228 can be used for bi-directional data communication with controller 202 over the data bus 207 (e.g., a 64 bit wide data bus). A quantity of circuits (e.g., sense amplifiers, buffers, etc.) of the sensing circuitry 223 can correspond to a size of a row of memory cells of the array 230. For example, if a row of the array has a size of 2 kB, the sensing circuitry 223 can include 16 k sense amplifiers (e.g., 2 kB*8 bits/byte=16 k). In another example, if a row of the array has a size of 8 kB, the sensing circuitry 223 can include 64 k sense amplifiers (e.g., 8 kB*8 bits/byte=64 k).

The control logic 224 can decode signals (e.g., commands) provided by control bus 203 from the controller 210. These signals can include chip enable signals, write enable signals, and/or address latch signals that can be used to control operations performed on the memory array 230, including data sense, data store, data movement (e.g., copying, transferring, and/or transporting data values), data write, and/or data erase operations, among other operations. Further, status and/or exception information can be provided from control logic 224 on the memory device 220 to the controller 210 and/or logic resource through an out-of-band bus 205. The control logic 224 can be a state machine, a sequencer, or some other type of controller.

Each bank 221 can be a smallest unit that can independently execute commands (e.g., one at a time) from the control logic 224. The banks 221-1, . . . , 221-M can be accessed substantially simultaneously. As used herein, the term "substantially" means that the characteristic need not be absolute, but is close enough so as to achieve the advantages of the characteristic. For example, "substantially simultaneously" is not limited to operations that are performed absolutely contemporaneously and can include timings that are intended to be simultaneous but due to manufacturing limitations may not be precisely simultaneously. For example, due to read/write delays that may be exhibited by various interfaces (e.g., LPDDR5 vs. PCIe), media controllers that are utilized "substantially simultaneously" may not start or finish at exactly the same time. For example, the banks 221 can be accessed such that they are writing data to and/or reading data from the banks 221 at the same time regardless of whether access to the respective bank 221 commences or terminates prior to the other.

As used herein, the term "physical page" can refer to a group of memory cells located on the same row of an array in a consecutive manner. Further, as used herein, a physical sub-page can refer to a portion of the memory cells corresponding to a physical page. For example, a physical page having a size of 128 bytes can include two sub-pages each having 64 bytes. As further used herein, a physical sub-page can be simply referred to as "sub-page". A physical page can have a size corresponding to a logical page. As used herein, a logical page can refer to a unit of memory management as defined by the operating system (e.g., the host 102 illustrated in FIG. 1). Accordingly, the size of logical pages can be defined by the host.

In some embodiments, the respective sensing circuitry 223 can operate with multiple "cuts" that can be independently activated to access (e.g., physical) sub-pages of the memory array 230. For example, each cut can include those circuits, such as sense amplifiers, buffers, main input/output (MIOs) of the I/O circuitry 228, etc. that can be activated to access a respective sub-page. In accessing, for example, a single sub-page, a respective cut corresponding to the sub-page can be activated, while the other cuts can remain deactivated (e.g., a deactivated state of the other cuts is maintained). This can provide benefits of accessing the memory array 230 at a finer granularity (e.g., in a unit of sub-page) than those DRAM devices in a manner that reduces power consumption associated with each read access (e.g., to the bank 221). For example, consider an example, in which a DRAM page having a size of 128 bytes are stored on a row of memory cells having a size of 8 kB. In this example, accessing a single DRAM page may still involve reading 8 kB (corresponding to the row) into sense amplifiers and/or read buffers, from which only the single DRAM page can be further transferred to the control logic (e.g., control logic 224), the controller (e.g., the controller 210), and/or the host (e.g., the host 102). In contrast, in a number of embodiments, accessing a sub-page (e.g., having a size of 64 bytes) can involve activating a portion of the sensing circuitry 223 (e.g., sense amplifiers, read buffers, MIOs, etc.) so as to read 64 bytes (corresponding to the sub-page) without necessarily reading data from the entire (e.g., whole) row of memory cells.

Accordingly, the repair can be done in a unit of sub-page rather than in a unit of a row of memory cells. For example, when hard bit errors are detected in one or more sub-pages (thereby, making it "bad" sub-pages) on a row of memory cells, those "good" sub-pages on the row can still be used and mapped to logical pages. These "good" sub-pages can be often mapped to the logical pages along with the other sub-pages on a different (e.g., spare) bank and/or rows of memory cells on a different bank. For example, a logical page can be mapped to one "good" sub-page in the first bank as well as to one "good" (e.g., spare) sub-page in second bank. In this example, the read access to the logical page can be done by substantially simultaneously accessing two sub-pages (e.g., each having 64 bytes) from two different banks 221. In some embodiments, the control logic 224 can mark the "bad" sub-pages as unusable (alternatively referred to as "retiring the sub-pages").

In some embodiments, a logical page can be mapped to two sub-pages of the same bank 221 (e.g., but in different rows). In this example, two sub-pages on the same bank 221 can be accessed in a serial (e.g., "back-to-back") manner as opposed to being accessed substantially simultaneously.

While banks 221 can be accessed substantially simultaneously, accessing one bank along with the other banks may be delayed if the bank is already open (e.g., currently executing another command from the control logic 224). This can be taken into account when mapping logical addresses to physical addresses in banks 221 and/or scheduling policy between execution of commands (e.g., by the control logic 224 and/or the controller 210) to reduce latencies in accessing banks 221 for a single read/write access.

Figure 3:
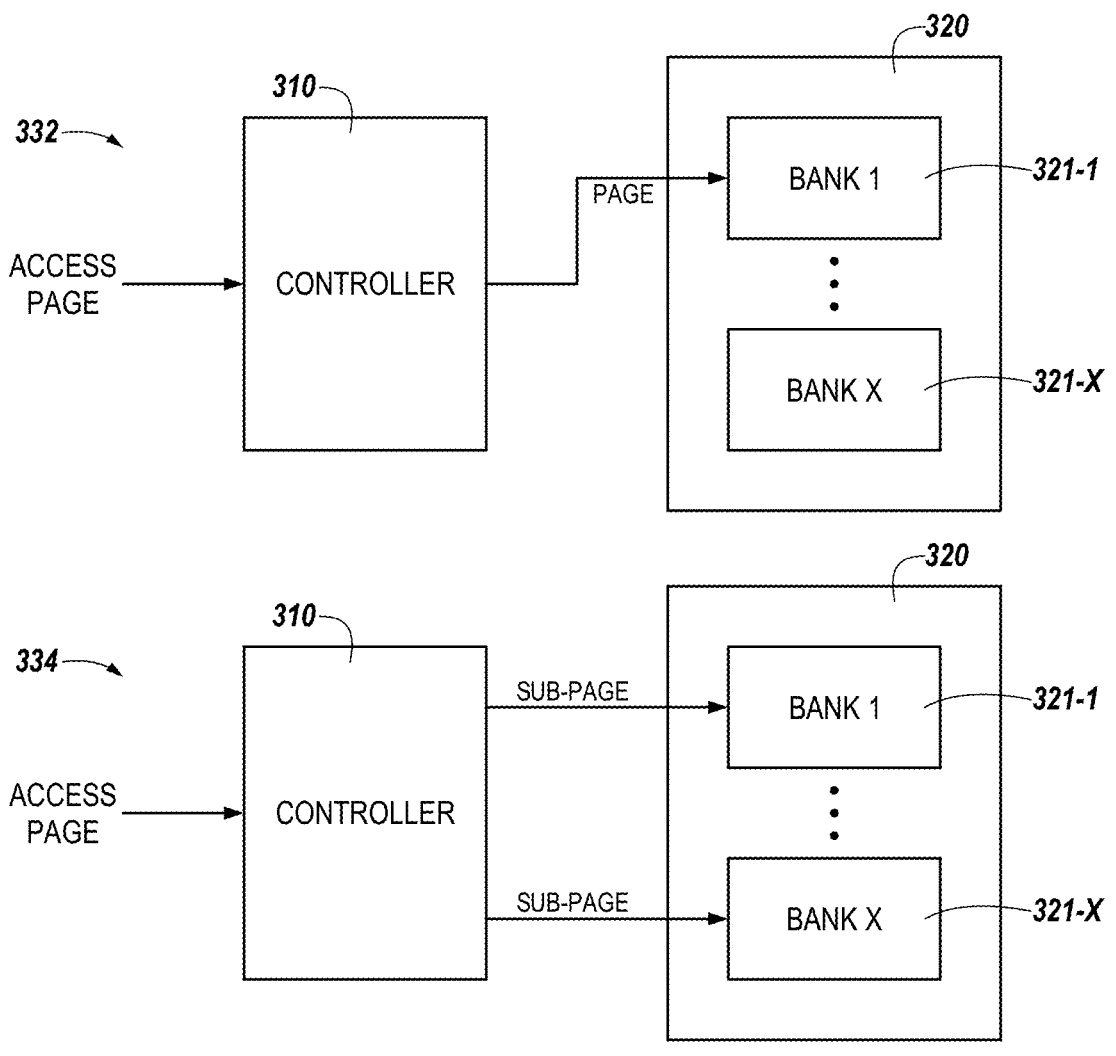
FIG. 3 is a block diagram illustrating accessing a number of memory banks of a memory device in accordance with a number of embodiments of the present disclosure.

FIG. 3 is a block diagram illustrating accessing a number of memory banks 321-1, . . . , 321-X (collectively referred to as banks 321) of a memory device 320 in accordance with a number of embodiments of the present disclosure. The memory device 320 and banks 321 can be analogous to the memory device 220 and banks 221 in FIG. 2, respectively. Further, a controller 310 can be analogous to the controller 210 in FIG. 2.

At 332, a logical page (e.g., having a size of 128 bytes) is mapped to a physical page (e.g., having a size of 128 bytes) of the bank 321-1. However, embodiments are not limited to a particular size a logical page or physical page can have. For example, a logical/physical page can have a size of 64 bytes, 256 bytes, etc. In some embodiments, a physical page can correspond to a single row of memory cells of the respective bank 321. Accordingly, an access request received at the controller 310 to access a physical page (e.g., of 128 bytes) from the banks 321 can be fulfilled by accessing the bank 321-1 for data (e.g., corresponding to a page size of 128 bytes).

At 334, as a result of the repair performed on the banks 321, a logical page (e.g., having a size of 128 bytes) is mapped to physical sub-pages (e.g., each having a size of 64 bytes) that are located respectively at the banks 321-1 and 321-X. The repair procedure can reduce the quantity of "good" memory cells that would otherwise be wasted via prior memory repair approaches that may remap entire rows of cells. In a number of embodiments, accessing different sub-pages (e.g., in different banks) that are mapped to the same logical page can be performed not only in a substantially simultaneous manner, but also in a deterministic manner. Alternatively speaking, accessing sub-pages that are mapped to the same logical page is guaranteed to occur within a predictable and known timing window.

FIG. 4 is a diagram illustrating a logical to physical (L2P) table 440 indicative of logical pages remapped in response to a repair performed in accordance with a number of embodiments of the present disclosure. The L2P table 440 can be stored in the memory 114 and managed by the controller 110 or in the memory 116 and managed by the control logic 224.

Rows 442-1, . . . , 442-Y of the table 440 respectively correspond to a logical to physical mapping entry, in which each logical page is mapped to a respective device page that can corresponding to one or more physical pages (e.g., of a single bank 221 illustrated in FIG. 2). As used herein, the term "device page" refers to memory cells that can be accessed together as a unit of host access. While the device page can have a size corresponding to a size of logical pages, memory cells corresponding to the device page may be distributed over different rows of memory cells such that the logical page mapped to one device page may be accessed by accessing different rows of memory cells. While the device page is "mapped" to a single physical page or multiple (e.g., portions of) physical pages, the logical page that is mapped to this device page can also be referred to as being mapped to the single physical page or multiple (e.g., portions of) physical pages.

As illustrated in FIG. 4, a row 442-1 indicates that a logical page "4012" (e.g., having a size of 128 bytes) as shown in FIG. 4 is mapped to a device page corresponding to a physical page "4201", a row 442-2 indicates that a logical page "4201" is mapped to a device page having two different sub-pages (e.g., as a result of the repair), which may be on different banks 221, and a row 442-Y indicates that a logical page "7890" is mapped to a device page corresponding to a physical page "9999". More particularly, a logical page "4201" as shown in FIG. 4 is mapped to a half portion (e.g., a sub-page having 64 bytes) of a physical page "4304" on bank "0" as well as to a half portion (e.g., a sub-page having 64 bytes) of a physical page "7890" on bank "1".

Although not shown in FIG. 4, each entry includes one or more bit indicative of whether a respective logical page is "repaired" (e.g., such that the logical page is mapped to multiple sub-pages, not to a single physical page) or not. For example, a bit having a first bit value (e.g., "0") can indicate that a respective logical page is repaired, while a bit having a second bit value (e.g., "1") can indicate that a respective logical page is not repaired yet (e.g., such that the logical page is mapped to a single physical page).

If banks (e.g., banks 221 shown in FIG. 2) have no more fractions (e.g., sub-pages) available for repairs, a last device page can be used for the repairs. For example, consider banks of a memory device (e.g., memory device 220 shown in FIG. 2) having a total number of 10,000 devices pages respectively having 10,000 physical pages and two (e.g., physical pages "4012" and "5048") of those 10,000 physical pages are partially determined to be unreliable. In this example, a logical page that was previously mapped to the physical page "4012" can be mapped to a sub-page of "4012" as well as to a sub-page of "5048" that are still valid (e.g., not unreliable). Further, a logical page that was previously mapped to the physical page "5048" can be mapped to a physical page "10,000" that was previously corresponding to the last device page. As a result of this remapping procedure using the last device page, a total number of devices pages is reduced to 9,999 with the last device page "10,000" that was present prior to the remapping eliminated.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
performing a scan operation to determine whether at least a portion of one or more arrays of memory cells of a memory device is bad by:

writing respective data patterns to a plurality of portions of the array of memory cells;
reading the data patterns from the plurality of portions; and
determining whether the data patterns read from the plurality of portions match the data patterns written to the plurality of portions to further determine whether the at least the portion of the array of memory cells is bad; and
repairing, responsive to one or more first memory cells of a first row of memory cells of a first array of memory cells being determined to be bad, the array by remapping one or more logical pages to:
one or more second memory cells of the first row of memory cells; and
one or more additional memory cells.

2. The method of claim 1, wherein:
the one or more additional memory cells are located on a second row of memory cells that is further located on a second array of memory cells; and
the method further comprises accessing data corresponding to the one or more logical pages by accessing the first and second arrays of memory cells substantially simultaneously.

3. The method of claim 1, further comprising performing the scan operation with an error correction code (ECC) feature disabled to not correct soft bit errors on the data patterns read from the plurality of portions.

4. The method of claim 1, further comprising performing the scan operation as a background operation.

5. The method of claim 1, further comprising performing the scan operation responsive to a power event of the memory device.

6. The method of claim 1, further comprising performing the scan operation during operation of the memory device.

7. An apparatus, comprising:
an array of memory cells;
sensing circuitry coupled to the array of memory cells; and
a controller coupled to the array of memory cells, the controller configured to;
remap, in response to one or more first memory cells of a first row of memory cells of the array being determined to be bad, one or more logical pages to:
one or more second memory cells of the first row of memory cells; and
one or more spare memory cells of a second row of memory cells; and
to access the one or more second memory cells or the one or more spare memory cells mapped to the one or more logical pages:
activate a first portion of the sensing circuitry coupled to the one or more second memory cells or the one or more spare memory cells; and
maintain a second portion of the sensing circuitry not coupled to the one or more second memory cells or the one or more spare memory cells in a deactivated state.

8. The apparatus of claim 7, wherein:
the array of memory cells is one of a plurality of arrays of memory cells respectively corresponding to a plurality of banks; and
the first and second rows of memory cells are located in a first bank of the plurality of banks.

9. The apparatus of claim 7, wherein:

the array of memory cells is one of a plurality of arrays of memory cells respectively corresponding to a plurality of banks; and the first row of memory cells is located in a first bank of the plurality of banks, while the second row of memory cells is located in a second bank of the plurality of banks.

10. The apparatus of claim 9, wherein the controller is configured to access multiple banks of the plurality of banks substantially simultaneously.

11. The apparatus of claim 7, wherein the one or more first memory cells and the one or more second memory cells correspond to a physical page having a dynamic random access memory (DRAM) page size.

12. The apparatus of claim 7, further comprising sensing circuitry coupled to the array of memory cells, the sensing circuitry comprising at least a plurality of sense amplifiers respectively coupled to the array of memory cells.

13. An apparatus, comprising:

a memory device comprising a plurality of arrays of memory cells respectively corresponding to a plurality of banks; and a controller coupled to the array of memory cells, the controller configured to communicate with the memory device according to a double data rate (DDR) protocol;

wherein the memory device comprises a control logic configured to access the plurality of arrays of memory cells in response to a command from the controller; and wherein the controller is further configured to remap, in response to one or more first memory cells of a first row of memory cells of a first bank being determined to be bad, one or more logical pages to:

one or more second memory cells of the first row of memory cells of the first bank; and one or more third memory cells of a second row of memory cells of a second bank.

14. The apparatus of claim 13, wherein the controller is further configured to store a logical to physical (L2P) table indicative of a mapping between logical addresses and physical addresses of the plurality of arrays.

15. The apparatus of claim 14, wherein the controller is configured to store the L2P table in a cache of the controller.

16. The apparatus of claim 14, wherein the L2P table further comprises a number of bits, each bit of the number of bits indicative of whether a logical address of a respective entry is mapped to different rows of memory cells or not.

17. The apparatus of claim 13, wherein the control logic is configured to store a logical to physical (L2P) table indicative of a mapping between logical addresses and physical addresses of the plurality of arrays.

18. An apparatus, comprising:

a plurality of arrays of memory cells respectively corresponding to a plurality of banks; and a controller coupled to the array of memory cells, the controller configured to:

access the array of memory cells according to a double data rate (DDR) protocol;

remap, in response to one or more first memory cells of a first row of memory cells of a first bank being determined to be bad, one or more logical pages to:

one or more second memory cells of the first row of memory cells of the first bank; and one or more third memory cells of a second row of memory cells of a second bank;

wherein the controller is further configured to store a logical to physical (L2P) table indicative of a mapping between logical addresses and physical addresses of the plurality of arrays; and wherein the L2P table further comprises a number of bits, each bit of the number of bits indicative of whether a logical address of a respective entry is mapped to different rows of memory cells or not.

\* \* \* \* \*